US012744185B2

(12) United States Patent
Cui et al.

(10) Patent No.: US 12,744,185 B2
(45) Date of Patent: Sep. 22, 2026

(54) CHAMBER IMPEDANCE MANAGEMENT IN A PROCESSING CHAMBER

(71) Applicant: Applied Materials, Inc., Santa Clara, CA (US)

(72) Inventors: Linying Cui, Cupertino, CA (US); James Rogers, Los Gatos, CA (US); Keith Hernandez, Santa Clara, CA (US); William Chin, Santa Clara, CA (US); Leonid Dorf, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 483 days.

(21) Appl. No.: 18/063,888

(22) Filed: Dec. 9, 2022

(65) Prior Publication Data

US 2024/0194446 A1 Jun. 13, 2024

(51) Int. Cl.
*H01J 37/32* (2006.01)

(52) U.S. Cl.
CPC .. *H01J 37/32155* (2013.01); *H01J 37/32128* (2013.01); *H01J 37/32568* (2013.01); *H01J 2237/024* (2013.01); *H01J 2237/24507* (2013.01); *H01J 2237/334* (2013.01)

(58) Field of Classification Search
USPC ........................................ 156/345.45, 345.24
See application file for complete search history.

(56) References Cited

U.S. PATENT DOCUMENTS

2016/0113103 A1* 4/2016 Van Zyl .................. H05H 1/46 315/111.21
2019/0385822 A1 12/2019 Marakhtanov et al.
2020/0043703 A1* 2/2020 French ................ C23C 16/5096
2020/0234921 A1 7/2020 Dorf et al.

(Continued)

FOREIGN PATENT DOCUMENTS

TW 201415523 A 4/2014
TW 202221756 A 6/2022

OTHER PUBLICATIONS

PCT/US2023/010922, International Search Report and Written Opinion dated Sep. 1, 2023, 10 pages.

(Continued)

*Primary Examiner* — Ram N Kackar
(74) *Attorney, Agent, or Firm* — Patterson + Sheridan, LLP

(57) ABSTRACT

Embodiments of the disclosure include an apparatus and a method for controlling plasma uniformity by controlling plasma density in the bulk plasma over the center region and circumferential edge region of the substrate. Plasma uniformity can be controlled by use of an RF tuning circuit coupled to one of a plurality of electrodes positioned relative to a substrate during plasma processing. By adjusting the electrical characteristics of at least one of the RF tuning circuits, the effect that the generated RF fundamental frequency and related RF harmonic frequencies have on the plasma processing results can be controlled. Beneficially, the use of one or more of the tuning circuits and methods of (Continued)

using the same may be used to provide individual tuning knobs for controlling reactive neutral species concentration, ion energy and angular distribution, ion directionality and directionality uniformity, and separately controlling ion flux and reactive neutral species uniformity across the surface of the substrate.

23 Claims, 8 Drawing Sheets

(56) References Cited

U.S. PATENT DOCUMENTS

| | | | | |
|---|---|---|---|---|
| 2020/0373126 | A1 * | 11/2020 | Na .................... | H01J 37/32183 |
| 2021/0134562 | A1 * | 5/2021 | Fairbairn .......... | H01J 37/32174 |
| 2022/0037129 | A1 * | 2/2022 | Koshimizu ....... | H01J 37/32706 |
| 2022/0115209 | A1 | 4/2022 | Kim et al. | |

OTHER PUBLICATIONS

Korean Office Action dated Nov. 19, 2025 for Application No. 10-2025-7017815, 8 pages.

Korean Office Action dated Dec. 29, 2025 for Application No. 10-2025-7020096, 12 pages.

Taiwanese Office Action for Application No. 112102593 dated Nov. 7, 2025.

* cited by examiner

CHAMBER IMPEDANCE MANAGEMENT IN A PROCESSING CHAMBER

BACKGROUND

Field

Embodiments herein are directed to plasma-generating devices used in semiconductor device manufacturing, particularly processing chambers configured to generate a plasma in a chamber volume and process a semiconductor substrate therein.

Description of the Related Art

Reliably producing high aspect ratio features is one of the key technology challenges for the next generation of semiconductor devices. One method of forming high aspect ratio features uses a plasma-assisted etching process, such as a reactive ion etch (RIE) process, to transfer openings in a masking layer to exposed portions of a substrate surface there below.

In a typical plasma-assisted etching process, the substrate is positioned on a substrate support, such as an electrostatic chuck (ESC) disposed in a processing chamber, a plasma is formed over the substrate, and ions are accelerated from the plasma towards the substrate across a plasma sheath, i.e., region depleted of electrons, formed between the plasma and the surface of the substrate. Openings in the mask layer are transferred to the substrate surface through a combination of chemical and physical interactions with plasma-generated neutrals and impinging ions that provide the anisotropic etch. Processing results at the substrate surface depend on, inter alia, characteristics of the plasma and plasma sheath formed there above.

Often, the plasma chamber is configured to form a capacitively coupled plasma and control the plasma sheath by use of two or more radio frequency (RF) powers. For example, a high-frequency component may be used to ignite and maintain the plasma, which determines the plasma density and thus the ion flux at the substrate surface, while a lower frequency component may be used to control a voltage drop across the plasma sheath.

However, non-uniformities in the plasma density and/or in the shape of the plasma sheath, due to the generation of harmonics created during the formation of the plasma, can cause undesirable processing result variations in etched feature profile and etch uniformity. Excessive processing non-uniformity may adversely affect and reduce device yield. Such non-uniformities are often particularly pronounced near the substrate edge and may be caused by inter alia, non-uniform power distribution, changes in chamber geometries, differences in surface material properties, and/or electrical discontinuities between the edge of the substrate and surfaces of the ESC disposed proximate thereto. It is believed that the material discontinuity at the substrate's edge is due to a boundary effect created by RF waves, which causes non-uniformity at the substrate's edge. Harmonic frequency waves created from the RF power used to generate the plasma have been shown to be a main root cause for etch rate and profile non-uniformity. Because the harmonics are generated at least in part by the non-linearity of the plasma sheath which is difficult to completely remove the effect of the harmonics on the formed plasma sheath, therefore managing and/or reducing the harmonic frequency waves properly is important for global plasma uniformity control. It is believed that due to the short wavelengths of some of the generated RF harmonics relative to the size of a substrate that is being processed, standing waves created by the generated harmonics can result in a non-uniform plasma being formed from center to edge of the substrate, and lead to etch rate non-uniformity and a global tilt in etched features.

Accordingly, there is a need in the art to control and/or minimize the adverse effects of the boundary effect and the generated RF harmonic waves inside the plasma chamber. There is also a need for a system, device(s), and methods that solve the problems described above.

SUMMARY

Embodiments provided herein generally include apparatus, e.g., plasma processing systems, and methods for the plasma processing of a substrate in a processing chamber. In some embodiments, aspects of the apparatus and methods are directed to improving processing uniformity across the surface of the substrate, reducing defectivity on the surface of the substrate, or both.

Embodiments of the disclosure include a plasma processing chamber. A substrate support assembly having a substrate supporting surface disposed within a processing volume of the plasma processing chamber. The substrate support assembly includes a first electrode, a first portion of dielectric material disposed over the first electrode, the first portion of dielectric material forming the substrate supporting surface; and a second electrode that is disposed a distance from the first electrode in a first direction that is parallel to the substrate supporting surface. A first voltage generator is electrically coupled to the first electrode. A radio frequency (RF) generator is electrically coupled to an RF electrode, wherein the RF generator is configured to generate a plasma within the processing volume by delivering an RF signal to the RF electrode, and the RF signal comprises a fundamental RF frequency. A first filter assembly is electrically coupled between the first electrode and the first voltage generator, wherein the first filter assembly includes one or more capacitive and inductive elements that are configured to substantially block the fundamental RF frequency and harmonics of the fundamental RF frequency received at the first electrode from flowing to the first voltage generator. A first tuning circuit electrically coupled between the first electrode and the first filter assembly, wherein the first tuning circuit includes a plurality of impedance generating elements that include at least one or more variable impedance element. The plurality of impedance generating elements of the first tuning circuit are configured to adjust one or more characteristics of the fundamental RF frequency and/or one of the harmonics of the fundamental RF frequency established at the first electrode when the plasma is generated in the processing volume.

Embodiments of the disclosure include a method of processing a substrate in a plasma processing chamber. The method includes the steps of generating and maintaining a plasma within a processing volume of the plasma processing chamber, wherein generating and maintaining the plasma is performed by delivering a radio frequency (RF) signal to an RF electrode, and the RF signal comprises a fundamental RF frequency. A first portion of the plasma is formed over a substrate supporting surface of a substrate support assembly and a first electrode. A second portion of the plasma is formed over the substrate supporting surface of the substrate support assembly and a second electrode. Adjusting, by use of a tuning circuit coupled to the first electrode, one or more characteristics of the fundamental RF frequency and/or a harmonics of the fundamental RF frequency at the first electrode relative to one or more characteristics of the fundamental RF frequency and/or the harmonics of the fundamental RF frequency at the second electrode to change a ratio of a plasma density in the second portion of the plasma to a plasma density in the first portion of the plasma Other embodiments include corresponding computer systems, apparatus, and computer programs recorded on one or more computer storage devices, each configured to perform the actions of the methods.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure will include apparatus and methods used to process a substrate in a plasma processing chamber. In some embodiments, aspects of the apparatus and methods are directed to improving plasma processing process results across the surface of the substrate. In some embodiments, the apparatus and methods provide for improved control over the uniformity of a plasma formed over the center and edge of a substrate and/or the distribution of ion flux and energies at the surface of the substrate.

Embodiments of the disclosure may include an apparatus and method for providing a pulsed-voltage (PV) waveform delivered from one or more pulsed-voltage (PV) generators to one or more electrodes within the processing chamber while a radio frequency (RF) generated RF waveform is provided from an RF generator to one or more RF electrodes within the processing chamber. The provided PV waveform(s) delivered from the one or more PV generators are configured to establish a nearly constant sheath voltage so as to provide a desirable ion energy distribution function (IEDF) at the surface of the substrate during the one or more plasma processing operations performed within the processing chamber.

Some embodiments of the disclosure include an apparatus and method for controlling plasma uniformity, e.g., by controlling electron density in the bulk plasma over the center region and circumferential edge region of the substrate. In some embodiments, the plasma uniformity is controlled by use of an RF tuning circuit coupled to one of a plurality of electrodes positioned relative to a substrate during plasma processing. In one example, the plasma uniformity is controlled by use of an RF tuning circuit coupled to a centrally located electrode beneath a substrate and/or an RF tuning circuit coupled to an electrode positioned beneath an edge of a substrate. Therefore, by adjusting the electrical characteristics of at least one of the RF tuning circuits, the effect that the generated RF fundamental frequency and related RF harmonic frequencies have on the plasma processing results can be controlled. More specifically, it has been found that by adjusting and controlling the properties of one or more of the generated RF fundamental and harmonic frequencies, such as amplitude and phase of the RF frequency, the plasma processing uniformity and process results can be improved. Beneficially, the use of one or more of the tuning circuits and methods of using the same may be used to provide individual tuning knobs for controlling reactive neutral species concentration, ion energy and angular distribution, ion directionality and directionality uniformity, and separately controlling ion flux and/or reactive neutral species uniformity across the surface of the substrate.

Plasma Processing System Examples

Figure 1A:
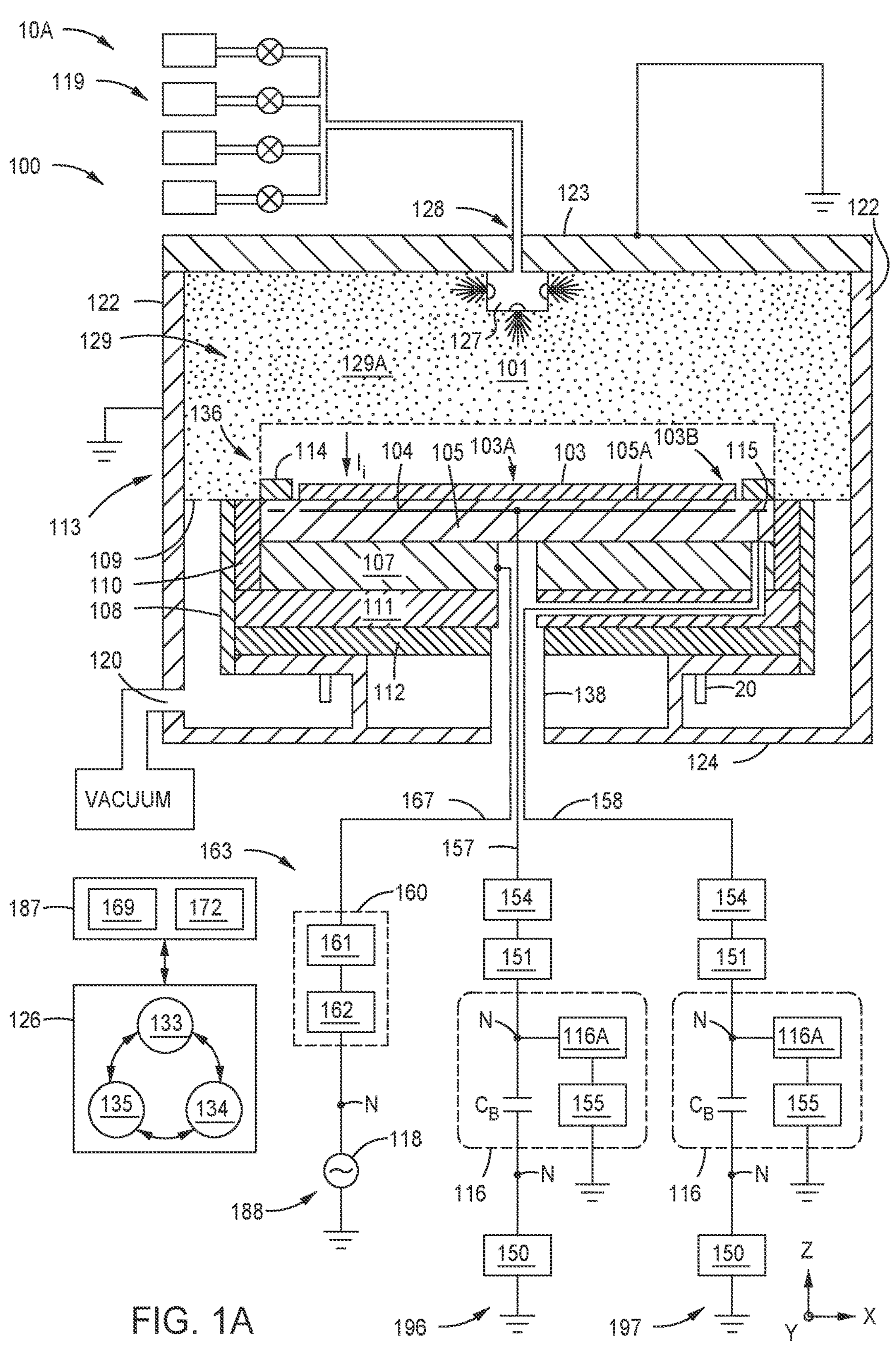
FIGS. 1A-1B are schematic cross-sectional views of processing systems, according to one or more embodiments, configured to practice the methods set forth herein.
Figure 1B:
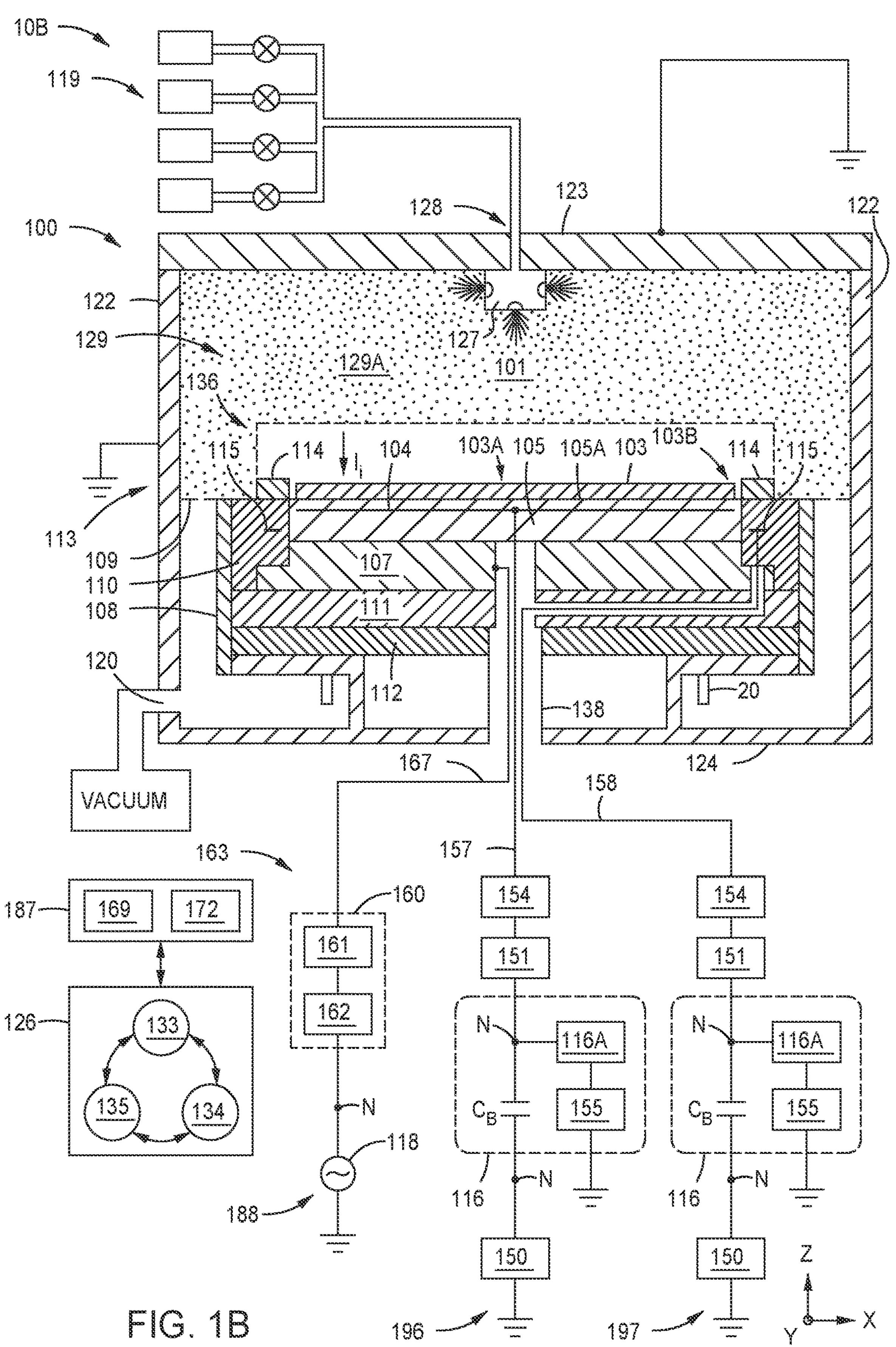
Figure 2:
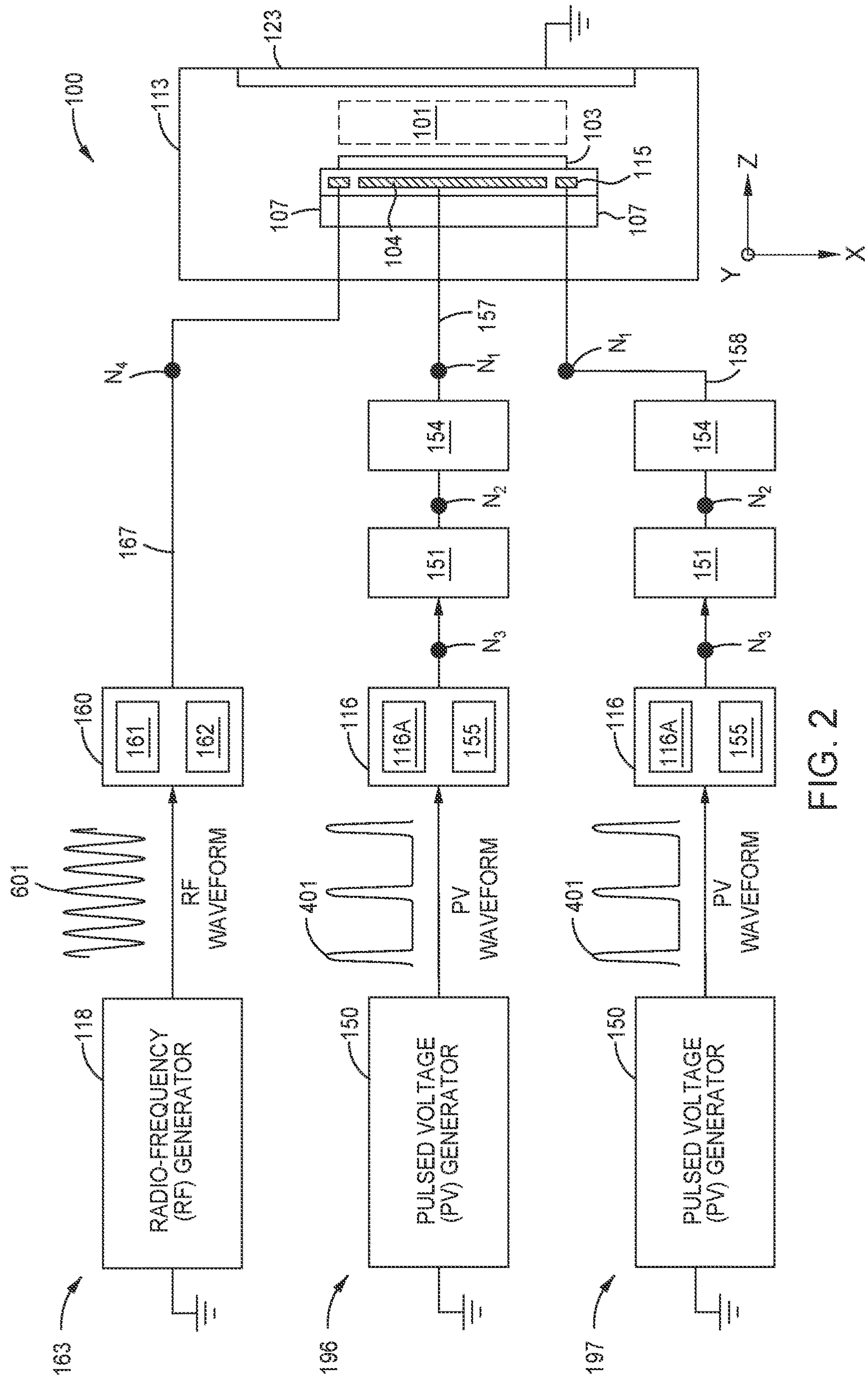
FIG. 2 is a simplified schematic diagram of one or both of the processing systems illustrated in FIGS. 1A-1B, according to one or more embodiments.
Figure 3:
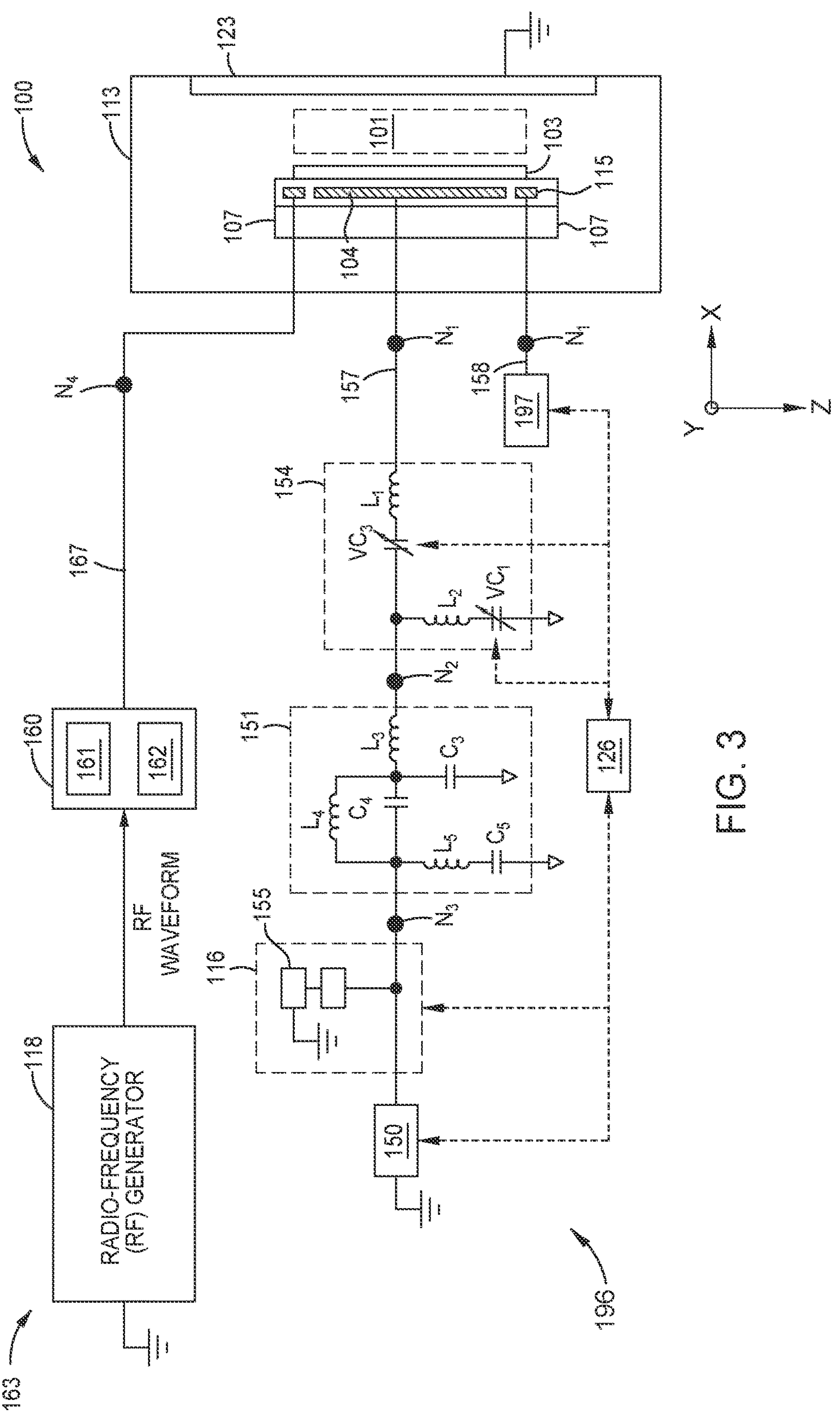
FIG. 3 is a simplified schematic diagram of PV source assembly that can be used in one or both of the processing systems illustrated in FIGS. 1A-1B, according to one or more embodiments.

FIGS. 1A and 1B are schematic cross-sectional views of respective processing systems 10A and 10B configured to perform one or more of the plasma processing methods set forth herein. FIG. 2 is a simplified schematic diagram of a processing scheme that can be used with one or both of the processing systems 10A and 10B, according to one or more embodiments disclosed herein. FIG. 3 illustrates an example of a tuning circuit and filter configuration within a PV source assembly that can be used in one or both of the processing systems 10A and 10B to control and adjust plasma uniformity over a surface of a substrate, according to one or more embodiments disclosed herein.

In some embodiments, the processing systems 10A and 10B illustrated in FIGS. 1A and 1B are configured for plasma-assisted etching processes, such as reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown in FIGS. 1A-1B, the processing systems 10A-10B are configured to form a capacitively coupled plasma (CCP), where the processing chamber 100 includes an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source (e.g., RF generator 118) is electrically coupled to one of the upper or lower electrodes (e.g., 123 or 136) and delivers an RF signal configured to ignite and maintain a plasma (e.g., the plasma 101), which is capacitively coupled to each of the upper and lower electrodes and is disposed in a processing region therebetween. Typically, the opposing one of the upper or lower electrodes (e.g., 123 or 136) may be coupled to ground or to a second RF generator (not shown). In FIGS. 1A-1B, one or more components of the substrate support assembly 136, such as the support base 107, may be electrically coupled to a plasma generator assembly 163, which includes the RF generator 118. Wherein, the chamber lid 123 may be electrically coupled to ground.

As shown in FIGS. 1A-1B, each of the processing systems 10A and 10B includes a processing chamber 100 that includes a substrate support assembly 136, a system controller 126, and a plasma control assembly 188. It is contemplated that in embodiments described herein that any one of or combination of the features, configurations, and/or structural components of the processing system 10A, e.g., the structural components of the substrate support assembly 136, and/or electrical components of the plasma control assembly 188, may be used in the processing system 10B, and vice versa.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases or vapors to the processing volume 129 from a processing gas source 119 that is in fluid communication therewith. In some embodiments, the chamber lid 123 includes a showerhead 127, and gases or vapors are distributed into the processing volume 129 through the showerhead 127. In some embodiments, the gas or vapors are delivered to the processing volume 129 using a gas inlet disposed through one of the one or more sidewalls 122 (not shown). A substrate 103 is loaded into, and removed from, the processing volume 129 through an opening (not shown) in one of the one or more sidewalls 122, which is sealed with a slit valve (not shown) during plasma processing of the substrate 103.

In some embodiments, a plurality of lift pins 20 movably disposed through openings formed in the substrate support assembly 136 is used to facilitate substrate transfer to and from a substrate supporting surface 105A. In some embodiments, the plurality of lift pins 20 are disposed above and are coupled to and/or are engageable with a lift pin hoop (not shown) disposed in the processing volume 129. The lift pin hoop may be coupled to a shaft (not shown) that sealingly extends through the chamber base 124. The shaft may be coupled to an actuator (not shown) that is used to raise and lower the lift pin hoop. When the lift pin hoop is in a raised position, it engages with the plurality of lift pins 20 to raise the upper surfaces of the lift pins above the substrate supporting surface 105A, lifting the substrate 103 therefrom and enabling access to a non-active (backside) surface the substrate 103 by a robot handler (not shown). When the lift pin hoop is in a lowered position, the plurality of lift pins 20 are flush with or recessed below the substrate supporting surface 105A, and the substrate 103 rests thereon.

The system controller 126, also referred to herein as a processing chamber controller, includes a central processing unit (CPU) 133, a memory 134, and support circuits 135. The system controller 126 is used to control the process sequence when processing the substrate 103, including the substrate biasing methods described herein. The CPU 133 is a general-purpose computer processor configured for use in an industrial setting for controlling the processing chamber 100 and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and may comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10A and/or 10B. Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10A and/or 10B to perform the various process tasks and various process sequences used to implement the methods described herein. In one embodiment, the program includes instructions that are used to perform one or more of the methods described herein.

The plasma control assembly 188 generally includes a plasma generator assembly 163, a first pulsed voltage (PV) source assembly 196 for establishing a first PV waveform at a bias electrode 104, and a second PV source assembly 197 for establishing a second PV waveform at an edge control electrode 115. In some embodiments, the plasma generator assembly 163 delivers an RF signal to the support base 107 (e.g., power electrode or cathode), which may be used to generate (maintain and/or ignite) a plasma 101 in a processing region 129 disposed between the substrate support assembly 136 and the chamber lid 123. In some embodiments, the RF generator 118 is configured to deliver an RF signal having a frequency that is greater than 400 kHz, such as an RF frequency of about 1 MHz or higher in frequency, or about 2 MHz or higher in frequency, such as about 13.56 MHz or higher in frequency, about 27 MHz or higher in frequency, about 40 MHz or higher in frequency, or, for example, between about 30 MHz and about 200 MHz, such as between about 30 MHz and about 160 MHz, between about 30 MHz and about 120 MHz, or between about 30 MHz and about 60 MHz.

In some embodiments, the plasma control assembly 188, a first PV source assembly 196 and/or a second PV source assembly 197 includes a tuning circuit 154, which, as discussed above, may be used to adjust one or more characteristics of the plasma 101 formed between the substrate support assembly 136 and the chamber lid 123. In some embodiments, the tuning circuit 154 may be used to adjust a density of the portion of the plasma 101 formed over a circumferential edge region 103B of a substrate 103 disposed on the substrate support assembly 136 relative to a density of the portion of the plasma 101 formed over the surface of the center region 103A of the substrate 103. As will be discussed further below, one or more of the edge tuning circuits 154 enable the manipulation of one or more characteristics of the harmonics of the RF power provided by the RF generator 118 used to maintain the plasma 101 in a region over the center region 103A and/or circumferential edge region 103B of the substrate support assembly 136. For example, a tuning circuit 154 in one or both of the PV source assemblies 196, 197 may be used to adjust one or more of the voltage, current, and/or phase characteristics of an RF signal received by the tuning circuit 154 and reflected by use of the tuning circuit 154, due to the delivery of the RF signal by the RF source 118 to the plasma 101. In this example, the adjustment of the voltage, current, and/or phase of the portion of the incoming RF signal that is reflected is used to adjust the plasma characteristics between the center region and edge region of the substrate.

As discussed further below, the tuning circuit 154 may be electrically coupled to a bias electrode 104 and/or an edge control electrode 115 disposed in the substrate support assembly 136. In some embodiments, an RF signal used to ignite and/or maintain the plasma 101 is delivered from the plasma generator assembly 163 to the support base 107, which is capacitively coupled to the bias electrode 104 and the edge control electrode 115 through a layer of dielectric material disposed therebetween. The edge tuning circuits 154 may be used to adjust one or more characteristics of the RF power used to maintain the plasma in the region over the bias electrode 104 and the edge control electrode 115, e.g., by adjusting the voltage, current, and/or the phase of the RF power at the bias electrode 104 relative to the edge control electrode 115.

In some embodiments, the differences between the voltages, currents, and/or phases of the RF power used to ignite and/or maintain the plasma in the regions over the edge control electrode 115 and the bias electrode 104 and their harmonic components are determined and/or monitored by measuring or determining the respective voltages, currents, and/or phases of the RF power at various RF frequencies received at the edge control electrode 115 and/or the bias electrode 104, or at the output of the tuning circuits 154. In some embodiments, one or more characteristics of the RF power at the edge control electrode 115 and/or the bias electrode 104 are measured and/or determined using the signal detection module 187. In some embodiments, one or more characteristics of the generated RF power are measured and/or determined by use of the signal detection module 187 that is communicatively coupled to the system controller 126. The signal detection module 187 is generally configured to receive electrical signals from electrical signal traces (not shown) that are electrically coupled to various components within the processing systems 10A and 10B, such as at nodes $N_1$, $N_2$, $N_3$, $N_4$ in FIGS. 2 and 3. The signal detection module 187 may include a plurality of input channels 172 (FIGS. 1A-1B) each configured to receive an electrical signal from a corresponding electrical signal trace and a data acquisition module 169. The electrical signals received by the input channels 172 can include, without limitation, one or more characteristics of the RF signal delivered to an electrode, the RF waveforms established at the output of the tuning circuits 154 which is coupled through a transmission line to one or both of the bias electrode 104 and the edge control electrode 115, the pulsed voltage (PV) waveforms established at one or both of the bias electrode 104 and the edge control electrode 115, and the chucking voltages delivered to one or both of the bias electrode 104 and the edge control electrode 115. The electrical signals received by the input channels 172 can be detected and monitored by use of an RF current sensor (not shown) that is configured to sense an RF current I(t) and an RF voltage sensor (not shown) that is configured to sense an RF voltage V(t). The RF current I(t) and RF voltage V(t) can be received by analog inputs of a microcontroller and may then be converted into digital representations thereof that are transferred to the system controller 126. The phase angle θ (time difference between I(t) and V(t)) may be determined with the phase detector (not shown) of the input channels 172 or may be determined after I(t) and V(t) have been converted into digital representations.

In some embodiments, the data acquisition module 169 is configured to generate a control signal that is used to automatically control one or more characteristics of the RF signal, RF waveforms, PV waveforms, and/or chucking voltages during substrate processing. In some embodiments, desired changes in the one or more characteristics are communicated to the signal detection module 187 by the system controller 126 and the data acquisition module 169 may be used to implement the desired change.

As discussed above, in some embodiments, the plasma generator assembly 163, which includes an RF generator 118 and an RF match assembly 160, is generally configured to deliver a desired amount of a continuous wave (CW) or pulsed RF power at a desired substantially fixed sinusoidal waveform frequency to an electrode, such as the support base 107 of the substrate support assembly 136 based on control signals provided from the system controller 126. In some embodiments, the support base 107 is an RF electrode that is electrically coupled to the RF generator 118 via an RF matching circuit 162 and a pulsed voltage (PV) waveform filter assembly 161, which are both disposed within the RF match assembly 160. The PV waveform filter assembly 161 includes one or more electrical elements that are configured to substantially prevent a current generated by the output of a PV waveform generator 150 from flowing through an RF power delivery line 167 and damaging the RF generator 118. The PV waveform filter assembly 161, acts as a high impedance (e.g., high Z) to the PV signal generated from a PV pulse generator within the PV waveform generator 150 and thus inhibits the flow of current to the RF matching circuit 162 and RF generator 118.

In some embodiments, the RF match assembly 160 and RF generator 118 are used to ignite and maintain a processing plasma 101 using the processing gases disposed in the processing volume 129 and fields generated by the RF power (RF signal) delivered to the support base 107 by the RF generator 118. The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion-resistant thermally conductive material, such as a corrosion-resistant metal, for example, aluminum, an aluminum alloy, or a stainless steel, and is coupled to the substrate support with an adhesive or by mechanical means.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof. In some embodiments, one or more characteristics of the RF power used to maintain the plasma 101 in the processing region over the bias electrode 104 are determined and/or monitored by measuring an RF waveform established at the bias electrode 104 (e.g., the first RF waveform 601 in FIG. 6). Typically, the first RF waveform is established by delivering an RF signal from the plasma generator assembly 163 to the substrate support 105, which is capacitively coupled to the bias electrode.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof. In some embodiments, the bias electrode 104 is electrically coupled to a clamping network 116, which provides a chucking voltage thereto, such as static DC voltage between about −5000 V and about 5000 V, using an electrical conductor, such as the coaxial power delivery line 157 (e.g., a coaxial cable). As will be discussed further below, the clamping network 116 includes bias compensation circuit elements 116A, a DC power supply 155, and a bias compensation module blocking capacitor, which is also referred to herein as the blocking capacitor CB. The blocking capacitor CB is disposed between the output of a pulsed voltage (PV) waveform generator 150 and the bias electrode 104, via the filter assembly 151 and the tuning circuit 154.

Referring to FIGS. 1A and 1B, the substrate support assembly 136 includes an edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1A, the edge control electrode 115 is positioned within a region of the substrate support 105. In some embodiments, as illustrated in FIG. 1A, the edge control electrode 115 includes a conductive mesh, foil, and/or plate that is disposed a similar distance (i.e., Z-direction) from the edge ring 114 as the bias electrode 104 from the substrate supporting surface 105A of the substrate support 105. In some other embodiments, such as shown in FIG. 1B, the edge control electrode 115 includes a conductive mesh, foil, and/or plate that is positioned on or within a region of a dielectric pipe 110, which surrounds at least a portion of the bias electrode 104 and/or the substrate support 105. The dielectric pipe 110 can be made of various insulators, such as aluminum oxide, aluminum nitride, or quartz. In some embodiments, the dielectric pipe 110 may include several parts made of the same or different materials. Alternately, in some other embodiments (not shown), the edge control electrode 115 is positioned within or is coupled to the edge ring 114, which is disposed on and adjacent to the substrate support 105.

In some embodiments, one or more characteristics of the RF power used to maintain the plasma 101 in the processing region over the bias electrode 104 and the edge control electrode 115 are determined and/or monitored for a waveform containing the fundamental and harmonic radio frequencies (RF) established at the bias electrode 104 and a waveform containing the fundamental and harmonic RF frequencies established at the edge control electrode 115. The fundamental and harmonic RF waves that are established at the electrodes and are to be controlled by one or more of the methods described herein will have the same RF frequency, but may have differing current, voltage and/or phase electrical characteristics. In one example, the primary RF frequency provided from the RF source 118 is provided at an radio frequency of about 40 MHz and the harmonic waves, which is to be controlled by use of a tuning circuit 154, which is coupled to an electrode (e.g., bias electrode 104 or edge electrode 115), has an RF frequency of about 80 MHZ (e.g., first harmonic). In some cases, the one or more characteristics of the fundamental and harmonic RF waves established at the electrodes may be manipulated by use of the tuning circuit 154 within one of the PV source assemblies, such as the PV source assembly 196 or 197 to adjust the plasma density in the region over the center or circumferential edge of the substrate 103. In this example, the tuning circuit 154 in the second PV source assembly 197 can be used to control the generation of activated species in the bulk plasma 101, which enables fine control over the ion and/or radical flux at the edge of the substrate 103 (edge region 103B) relative to the center region 103A of the substrate 103.

In some embodiments and as shown, the PV source assemblies 196 and 197 include a clamping network 116 that is electrically coupled to the bias electrode 104 and edge control electrode 115 using an electrical conductor, such as coaxial power delivery lines 157 and 158, respectively, (e.g., a coaxial cables). The clamping network 116 can be used to deliver a static DC voltage, such as between about −5000 V and about 5000 V, to the edge control electrode and may include one or more bias compensation circuit elements 116A, a DC power supply 155, and a blocking capacitor CB. The blocking capacitor CB is disposed between the output of a pulsed voltage (PV) waveform generator 150 and the edge control electrode 115. A clamping network 116 can be used to deliver a clamping voltage to the edge control electrode 115 that is the same or is different from the clamping voltage delivered to the bias electrode 104 provided from the other clamping network 116 (first PV source assembly 196) to provide for an additional process tuning knob.

In some embodiments, the processing chamber 100 further includes the dielectric pipe 110, or collar, that at least partially circumscribes portions of the substrate support assembly 136. The dielectric pipe 110 provides dielectric barrier between the RF hot substrate support assembly 136 and a grounded liner 108, and also protects the substrate support 105 and/or the support base 107 from contact with corrosive processing gases or plasma, cleaning gases or plasma, or byproducts thereof. Typically, the dielectric pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Process Control Schemes

FIG. 2 is a simplified schematic diagram of a biasing and edge control scheme that can be used with one or both of the processing systems 10A-10B illustrated in FIGS. 1A and 1B. As shown in FIG. 2, the RF generator 118 and PV waveform generators 150 are configured to deliver an RF waveform and pulsed-voltage waveforms, respectively, to one or more electrodes disposed within the processing volume 129 of the processing chamber 100. In one embodiment, the RF generator 118 and PV waveform generators 150 are configured to simultaneously deliver an RF waveform and pulsed-voltage waveform(s) to one or more electrodes disposed within the substrate support assembly 136.

In one non-limiting example, the RF generator 118 and a PV waveform generator 150 are configured to deliver an RF waveform and pulsed-voltage waveform to the support base 107 and bias electrode 104, respectively, which are both disposed in the substrate support assembly 136. In another example, the RF generator 118, a first PV waveform generator 150, and a second PV waveform generator 150 are configured to deliver an RF waveform, a first pulsed-voltage waveform and a second pulsed-voltage waveform to the support base 107, the bias electrode 104, and the edge control electrode 115, respectively, which are all disposed in the substrate support assembly 136. The RF generator 118 is configured to provide an RF signal that includes a sinusoidal RF waveform to one or more electrodes disposed in the chamber body 113 by delivering the RF signal through the RF (plasma) match assembly 160, which includes the RF matching circuit 162 and the PV waveform filter assembly 161. Additionally, each of the PV waveform generators 150 are configured to provide a pulsed voltage (PV) waveform 401 (FIG. 4), which typically includes a series of voltage pulses (e.g., microsecond or sub-microsecond voltage pulses, including nanosecond voltage pulses), to the one or more electrodes disposed in the chamber body 113 by establishing a PV waveform at the bias electrode 104 or the edge electrode 115 through a radio frequency (RF) filter assembly 151 and a tuning circuit 154.

Referring to FIG. 3, the RF filter assembly 151 includes a plurality of inductors and capacitors that are configured to eliminate or at least minimize the RF signals, which include the fundamental RF frequency and its associated harmonics, generated by the delivery of RF power to the formed plasma 101 by the RF generator 118, from making their way back to the high voltage supply 155 and PV waveform generator 150. In general, a RF filter assembly 151 will include at least one of a parallel resonant circuit, a low pass filter, and one or more tuned shunt frequency elimination circuits for use in the power delivery line that couples a high voltage supply 155 and/or a PV waveform generator 150 to its respective electrode. In one example, as shown in FIG. 3, the parallel resonant circuit includes an inductor L4 and a capacitor C4 that are configured to block the fundamental frequency generated by the RF generator 118 (e.g., 40 MHZ). In one example, the tuned shunt frequency elimination circuit, which includes a series inductor $L_5$ and capacitor C5 arrangement that is coupled between the power delivery line 157 and ground, is setup to attenuate (reduce in amplitude) a harmonic of the fundamental frequency generated by the RF generator 118 (e.g., 80 MHz or 160 MHZ). In some embodiments, the RF filter assembly 151 may contain multiple tuned shunt frequency elimination circuits (not shown) that are configured to separately attenuate different harmonic frequencies from making their way back to the high voltage supply 155 and PV waveform generator 150. In another example, as shown in FIG. 3, a low pass filter includes an inductor L3 and a capacitor C3 that are configured to allow the PV waveform to pass through the RF filter assembly and to substantially attenuate the fundamental RF frequency and all of the harmonics generated by the RF generator 118. The low pass filter portion of the RF filter assembly 151 may be configured to attenuate RF frequencies greater than 400 kHz, such as greater than 500 kHz, or even greater than 1 MHz.

As discussed above, a tuning circuit 154 within a PV source assembly 196, 197 is generally configured to control and adjust the uniformity of a plasma formed between the chamber lid 123 and the substrate support assembly 136, e.g., by controlling the plasma density (i.e., the free electron density in the bulk plasma 101) over the center and/or edge of the substrate 103. In some embodiments, as shown in FIG. 1A and FIG. 2, a tuning circuit 154 is electrically coupled between the bias electrode 104 (e.g., centrally positioned electrode), the RF filter assembly 151 and PV waveform generator 150 of the first PV source assembly 196, and a tuning circuit 154 is electrically coupled between the edge control electrode 115 (edge biasing electrode), the RF filter assembly 151 and PV waveform generator 150 of the second PV source assembly 197. However, in some embodiments, a tuning circuit 154 is only positioned within one of the PV source assemblies 196 or 197.

Referring to FIG. 3, the tuning circuit 154 includes a plurality of inductors and capacitors that are configured to control or affect the signal amplitude and/or phase of the fundamental and/or harmonic RF frequencies coupled to the bias electrode 104 and/or the edge control electrode 115 by modifying the RF impedance that the RF signal sees at the electrodes 104, 115.

This series or parallel or more complex geometry circuit may be used to control the phase and/or amplitude of the RF signal coupled to the bias electrode 104 and/or the edge control electrode 115 by varying the impedance of the tuning circuit 154 which includes a first tunable impedance comprising series or parallel connected inductor $L_1$ and variable capacitor $VC_3$, and second tunable impedance comprising series or parallel connected inductor $L_2$ and variable capacitor $VC_1$. In one example, the first tunable impedance is coupled between the second tunable impedance and a respective electrode 104 or 115. Since the RF impedance is very high at node $N_2$ of the filter assembly 151, the only path for RF to travel from the electrode 104 or 115 would be through the tuning circuit 154, wherein at least one node of the tuning circuit 154 is coupled to an RF ground. Each one of the first and second tunable impedances may be adapted to independently tune to a resonant frequency, above the resonant frequency or below the resonant frequency, e.g., the resonant frequency may be the frequency of the RF generator 118 and/or harmonics thereof.

In some embodiment, when the total impedance of the tuning circuit 154 and the power delivery line 157, 158 are tuned to be very low and substantially resistive at a harmonic frequency, the RF voltage of the substrate or edge ring surface at that harmonic frequency is substantially zero. This tuning configuration results in the RF power absorbed by the plasma at that harmonic frequency to be minimized or negligible, thus minimizing the plasma non-uniformity effect created by the harmonic frequency. Due to the settings of the impedance generating components disposed within the tuning circuit 154, the tuning circuit 154 can thus be used to attenuate and/or alter the effect the harmonic waveform has on the RF voltage established at the substrate.

As the first and second tunable impedances are tuned above and/or below the resonant frequency then the total impedance of the tuning circuit and the power delivery line will become capacitive or inductive which will change the RF voltage and phase angle between the RF voltage and RF current at the electrode 104 or 115. The RF signal amplitude may also be affected, which can be dependent upon the RF impedance at the electrodes 104 and 115. As the properties of the load created by the generated plasma change, the tuning circuit 154 can be adjusted to compensate for the variation in the RF signal received by the tuning circuit 154 at the harmonic frequency.

The tuning circuit 154 may further comprise a plurality of first tunable impedances and a plurality of second tunable impedances, each having a different resonant frequency (e.g., harmonic frequencies), and tunable to different combinations of frequencies at, above or below the associated resonant frequency. Thus, different combinations of RF amplitudes and phase angle adjustments between the RF voltages and currents of one or more frequencies may be obtained. The frequencies do not have to be harmonically related so long as there are tunable impedances for these frequencies. Series, parallel or more complex connections between first and second tunable impedances having different resonant frequencies are also contemplated herein.

The variable capacitors $VC_1$ and VCs may have a capacitive range, but are not limited to, from about 3 pF to about 5000 pF. Inductors $L_1$ and $L_2$ may have an inductive range of, but is not limited to, about 0.01 μH to about 1000 μH. A motor position actuator of the position control and monitoring circuit of the system controller 126 may also include a position sensor that indicates the mechanical position of the adjustable element, e.g., amount of shaft rotation of the variable vacuum capacitor or a synchronized stepper motor position count after minimum and maximum rotation positions have been determined (detection of maximum and minimum clockwise and counter-clockwise shaft rotations). Position values may be correlated in a capacitance (or inductance)—position value table so that capacitance and/or inductance values may be monitored and set to a desired position based upon a required capacitance/inductance value. Tuning element position values may be used for monitoring and presetting tuning element positions according to the teachings of this disclosure.

In some embodiments, the type of tuning circuit 154 can be selected based on the desired ability to control the plasma density distribution that can be achieved by adjusting one or more parameters of the tuning circuit 154 so that one or more characteristics of the RF waveform established at the edge control electrode 115, relative to the one or more characteristics of the first RF waveform established at the bias electrode 104, can be adjusted. As briefly discussed above, FIG. 3 schematically illustrates an example of a processing chamber 100 that includes a plasma generator assembly 163 and a first PV source assembly 196, which includes a schematic representation of a tuning circuit 154 and RF filter assembly 151. For simplicity of discussion, and not intending to limit the scope of the disclosure provided herein, FIG. 3 only includes a detailed schematic view of the first PV source assembly 196. However, the second PV source assembly 197 may also be similarly configured and separately controlled.

The settings of the impedance generating components within the tuning circuit 154 can also be used to attenuate the harmonic RF waveform, which will generally include a reduction in the RF power found at node $N_1$ (FIG. 3). In some embodiments, the settings of the impedance generating components within the tuning circuit 154 are used to substantially or completely attenuate the harmonic RF waveform so that the attenuated harmonic RF waveform reaching the RF filter assembly 151 (e.g., node $N_2$) is non-existent or negligible. The RF filter assembly 151 is then configured to further attenuate the attenuated harmonic RF waveform to a level that is non-existent or negligible at the output of the PV waveform generator 150 and/or high-voltage module 155 (e.g., node $N_3$).

Figure 4:
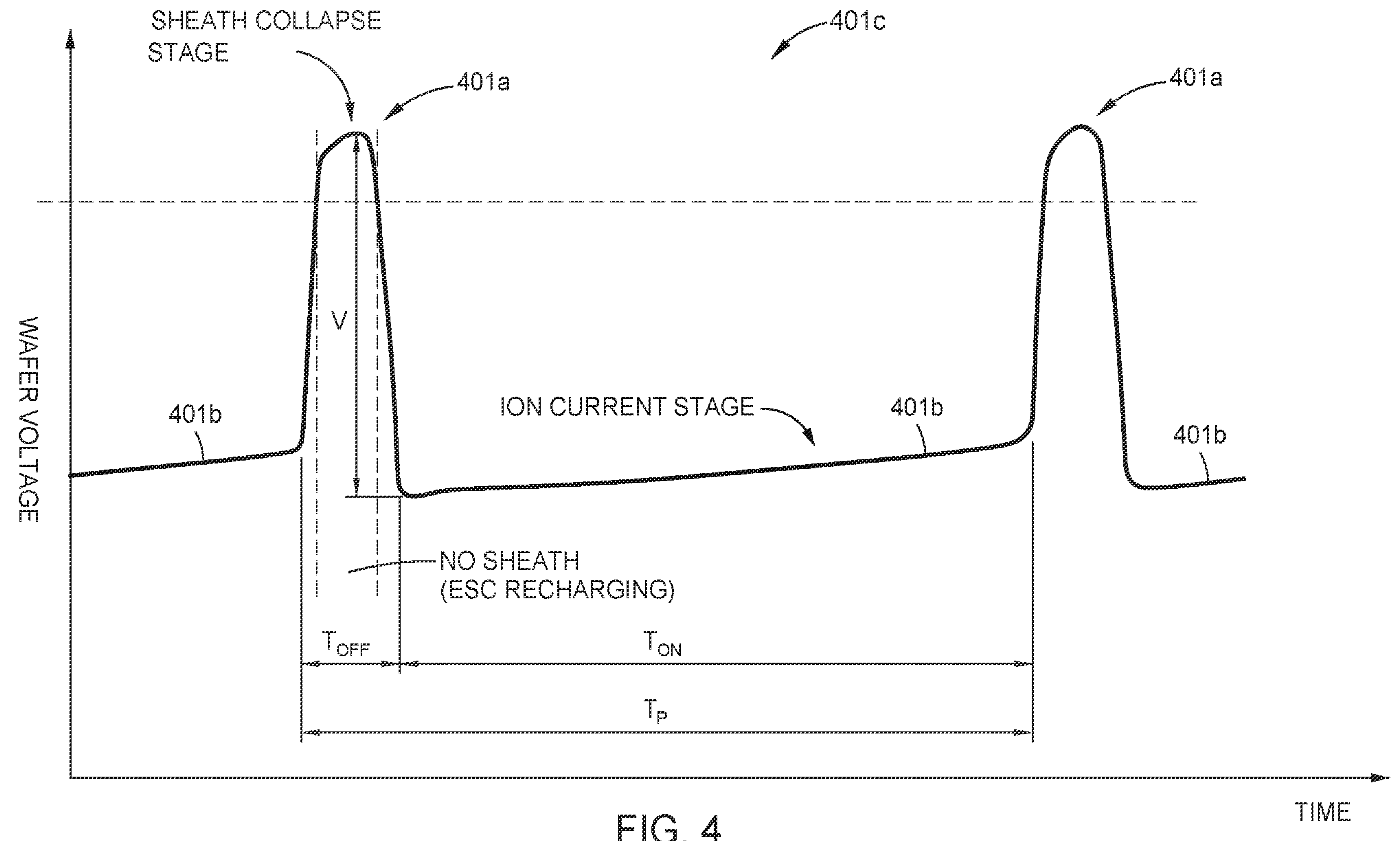
FIG. 4 illustrates a PV waveform that includes a plurality of voltage pulses that can be provided within a power delivery line of the first PV source assembly illustrated in FIG. 3, according to one or more embodiments.

In some embodiments, as illustrated in FIG. 3, due to the configuration of the RF filter assembly 151 and tuning circuit 154, the PV waveform 401, generated by the PV waveform generator 150, is allowed to pass through the RF filter assembly 151 and tuning circuit 154 and be applied to the bias electrode 104 and established on the substrate 103. FIG. 4 illustrates an example of a PV waveform 401 that includes a plurality of voltage pulses. In this example, the PV waveform 401 provided by the PV waveform generator 150 includes a plurality of asymmetric shaped voltage pulses 401*c* that each include two main stages: an ion current stage 401*b* and a sheath collapse stage 401*a*. At the end of the ion current stage 401*b*, and the start of the sheath collapse stage 401*a*, a rising edge of the PV waveform 401 is created by the PV source assembly, which forms part of a typically short narrow positive pulse that transitions from a negative voltage level to a positive voltage that is greater than zero volts. The duration of the positive section of the pulse (e.g., $T_{OFF}$) can be varied, and, in some embodiments, is between 1% and 90% of the waveform period ($T_P=T_{OFF}+T_{ON}$), such as between 5% and 85% of the waveform period ($T_P$). In one example, the repetition frequency of the voltage pulses within the PV waveform 401 may be between about 100 kHz and 500 kHz, such as between 200 KHz and 400 kHz. The overall control of the delivery of the PV waveform from a PV waveform generator 150 is controlled by use of signals provided from the system controller 126. In one non-limiting example, a PV waveform generator 150 is configured to maintain a predetermined, substantially constant negative voltage across its output (i.e., to ground) during the ion current stage 401*b*, by repeatedly closing and opening one or more switches within the PV waveform generator 150 at a predetermined rate. In one example, during a first phase of a pulse interval a first switch is used to connect a high voltage supply to the bias electrode 104, and during a second phase of the pulse interval a second switch is used to connect the bias electrode 104 to ground.

Beneficially, a tuning circuit 154 may be configured to provide a broad range of desired plasma processing conditions over a surface of a substrate 103 to control and/or adjust the plasma density distribution at different points between the center and edge of the substrate 103.

In some embodiments, the tuning circuit 154 is automatically adjusted by commands from the system controller 126 to maintain desired processing conditions, such as to account for plasma impedance changes at the fundamental frequency and/or one or more of the harmonic frequencies during a gas flow change or power change or pulse voltage change. For example, the methods may be used to automatically adjust the capacitance VC1 and/or VC3 of a tuning circuit to account for a detected change of RF power found in a harmonic of the fundamental frequency. In some embodiments, the system controller 126, by use of the signal detection module 187, may be configured to: detect signals of one or more electrical parameters at corresponding nodes $N_1$ of the processing system 10A, 10B; determine whether the processing system 10A, 10B is operating within desired processing conditions by comparing the characteristics of the detected signals with one or more control limits stored in memory; and, when the electrical signal characteristics are outside of the control limits, adjust one or more of variable impedance components within the tuning circuit 154 to correct for the undesirable variation. Some embodiments include automatically adjusting the tuning circuit 154, such as adjusting the variable capacitance VC1 or VC3 to maintain a desired RF voltage amplitude ratio, RF current amplitude ratio, and/or RF phase difference between at the fundamental and a harmonic frequency at the edge control electrode 115 and/or the bias electrode 104.

In another embodiment, based on plasma processing result data collected from substrates processed within a plasma processing chamber, adjustments can be made to the one or more of variable impedance components to correct for an undesirable processing result seen on one or more previously processed substrates, such as an increased etch rate in the center versus the edge of the one or more substrates. In one example, the system controller 126, or a system user, may set the one or more of variable impedance components within the tuning circuit 154 to a first set point that is intended to correct for the previously found undesirable processing result by adjusting the effect that the fundamental and/or a harmonic frequency has on the plasma density and/or sheath formed over the surface of the substrate. One or more programs stored within the system controller 126, or a system user, can further alter the processing results by adjusting the set point of the one or more of variable impedance components from the first set point based on additional data received from a subsequent analysis of a substrate processed using the variable impedance components' first set point.

Plasma Processing Examples

FIGS. 5A-5D illustrate experimentally generated RF waveforms, which are a superposition of the fundamental and harmonic RF frequencies, that were established at two electrodes within a processing chamber 100. Each of the FIGS. 5A-5D include an RF voltage waveform 501V and RF current waveform 501C, which were both established at an edge electrode 115, and an RF voltage waveform 502V, which was established at a bias electrode 104. The variation found between each of the FIGS. 5A-5D include the adjustment of the variable capacitor VC1 in a tuning circuit that is similarly configured as the tuning circuit 154 illustrated in FIG. 3.

Figure 5B:
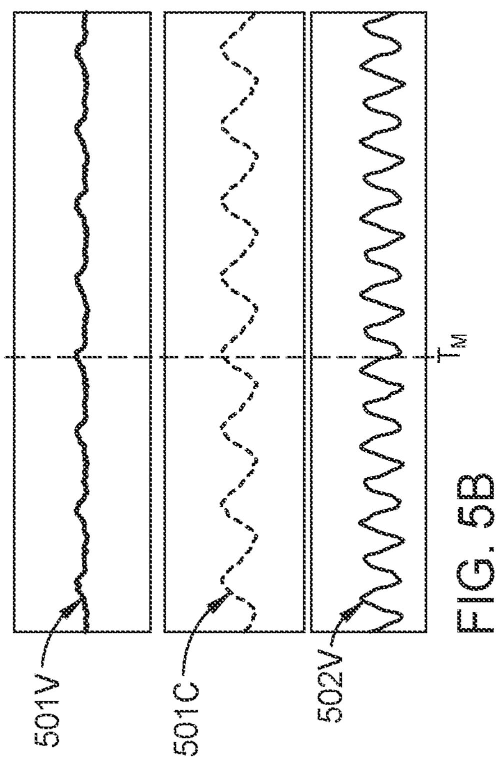
FIGS. 5A-5D illustrate example radio frequency (RF) waveforms that can be established at an electrode using embodiments described herein.
Figure 5D:
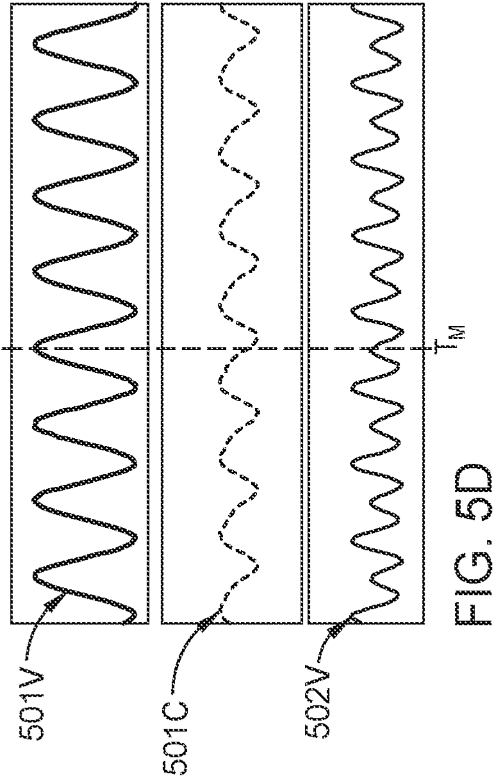
Figure 5A:
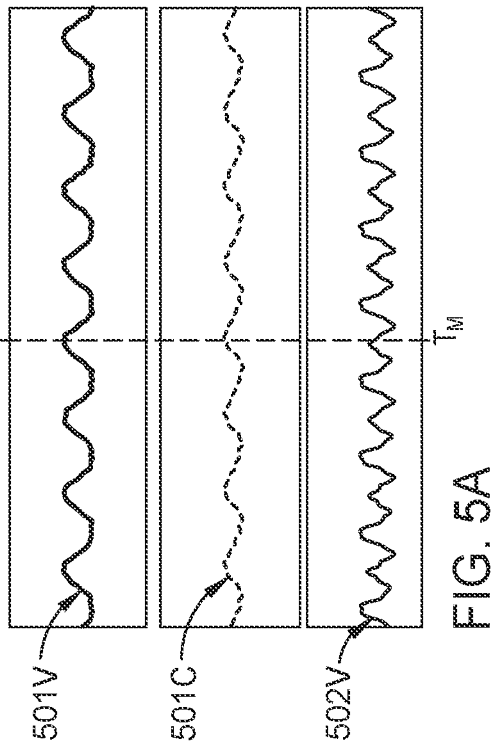

As shown in FIG. 5A, a first setting of the variable capacitors VC1 and VC3 of a tuning circuit 154 was set to a first setting to achieve an RF voltage waveform 501V and RF current waveform 501C that each have a first amplitude and are in phase with each other as shown at time $T_M$. Similarly, the RF voltage waveform 502V measured at the bias electrode 104 has a first amplitude and is in phase with the RF voltage waveform 501V at time $T_M$.

As shown in FIG. 5B, a second setting of the variable capacitors VC1 and VC3 of a tuning circuit 154 was set to a second setting to achieve a new second RF voltage waveform 501V, second RF current waveform 501C and second RF voltage waveform 502V were established at the edge electrode 115 and bias electrode 104, respectively. As shown in FIG. 5B, the second setting of the variable capacitors VC1 and VC3 in the tuning circuit 154 achieves a second RF voltage waveform 501V and second RF current waveform 501C that each have a second amplitude and remain in phase with each other, as shown at time $T_M$. The amplitude of the second RF voltage waveform 501V has been reduced from the first RF voltage waveform 501V illustrated in FIG. 5A. The second amplitude of the second RF current waveform 501C has increased from the first RF current waveform 501C illustrated in FIG. 5A due to the change in the variable capacitors VC1 and VC3. The second RF voltage waveform 502V measured at the bias electrode 104 has a second amplitude that is greater than the first RF voltage waveform 502V and is shifted to a position that is out of phase with the second RF voltage waveform 501V at time $T_M$.

Figure 5C:
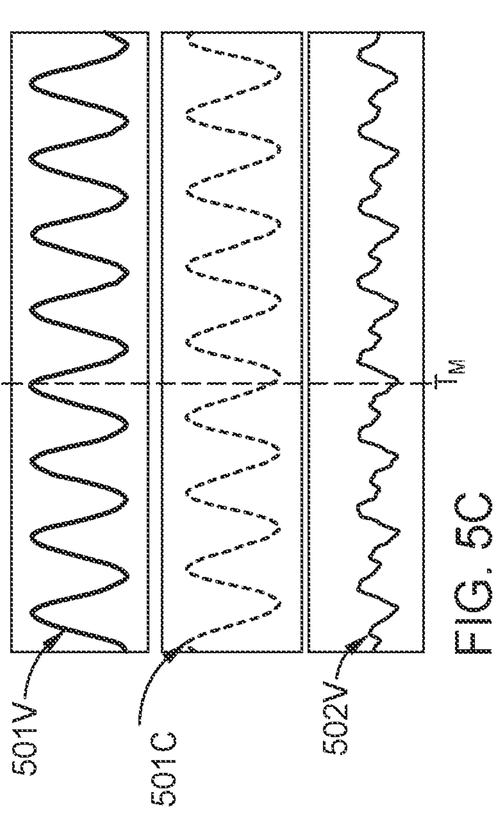

Referring to FIG. 5C, a third setting of the variable capacitors VC1 and VC3 of a tuning circuit 154 was set to a third setting to achieve a new third RF voltage waveform 501V, third RF current waveform 501C and third RF voltage waveform 502V were established at the edge electrode 115 and bias electrode 104, respectively. As shown in FIG. 5C, the third setting of the variable capacitors VC1 and VC3 in the tuning circuit 154 achieves a third RF voltage waveform 501V and third RF current waveform 501C that each have a third amplitude, and are shifted relative to each other such that they are out of phase with each other, as shown at time $T_M$. The amplitude of the third RF voltage waveform 501V has increased from the first RF voltage waveform 501V illustrated in FIG. 5A. The amplitude of the third RF current waveform 501C has increased from the first RF current waveform 501C illustrated in FIG. 5A. The third RF voltage waveform 502V measured at the bias electrode 104 has a third amplitude that is greater than the first RF voltage waveform 502V and is shifted to a position that is nearly 180° out of phase with the third RF voltage waveform 501V at time $T_M$.

Referring to FIG. 5D, a fourth setting of the variable capacitors VC1 and VC3 of a tuning circuit 154 was set to a fourth setting to achieve a new fourth RF voltage waveform 501V, fourth RF current waveform 501C and fourth RF voltage waveform 502V were established at the edge electrode 115 and bias electrode 104, respectively. As shown in FIG. 5D, the fourth setting of the variable capacitors VC1 and VC3 in the tuning circuit 154 achieves the fourth RF voltage waveform 501V and fourth RF current waveform 501C that each have a fourth amplitude, and are shifted relative to each other such that they are out of phase with each other, as shown at time $T_M$. The amplitude of the fourth RF voltage waveform 501V has increased from the first RF voltage waveform 501V illustrated in FIG. 5A. The amplitude of the fourth RF current waveform 501C has increased from the first RF current waveform 501C illustrated in FIG. 5A. The fourth RF voltage waveform 502V has a fourth amplitude that is greater than the first RF voltage waveform 502V and is in phase with the third RF voltage waveform 501V at time $T_M$.

Figures 6A, 6B:
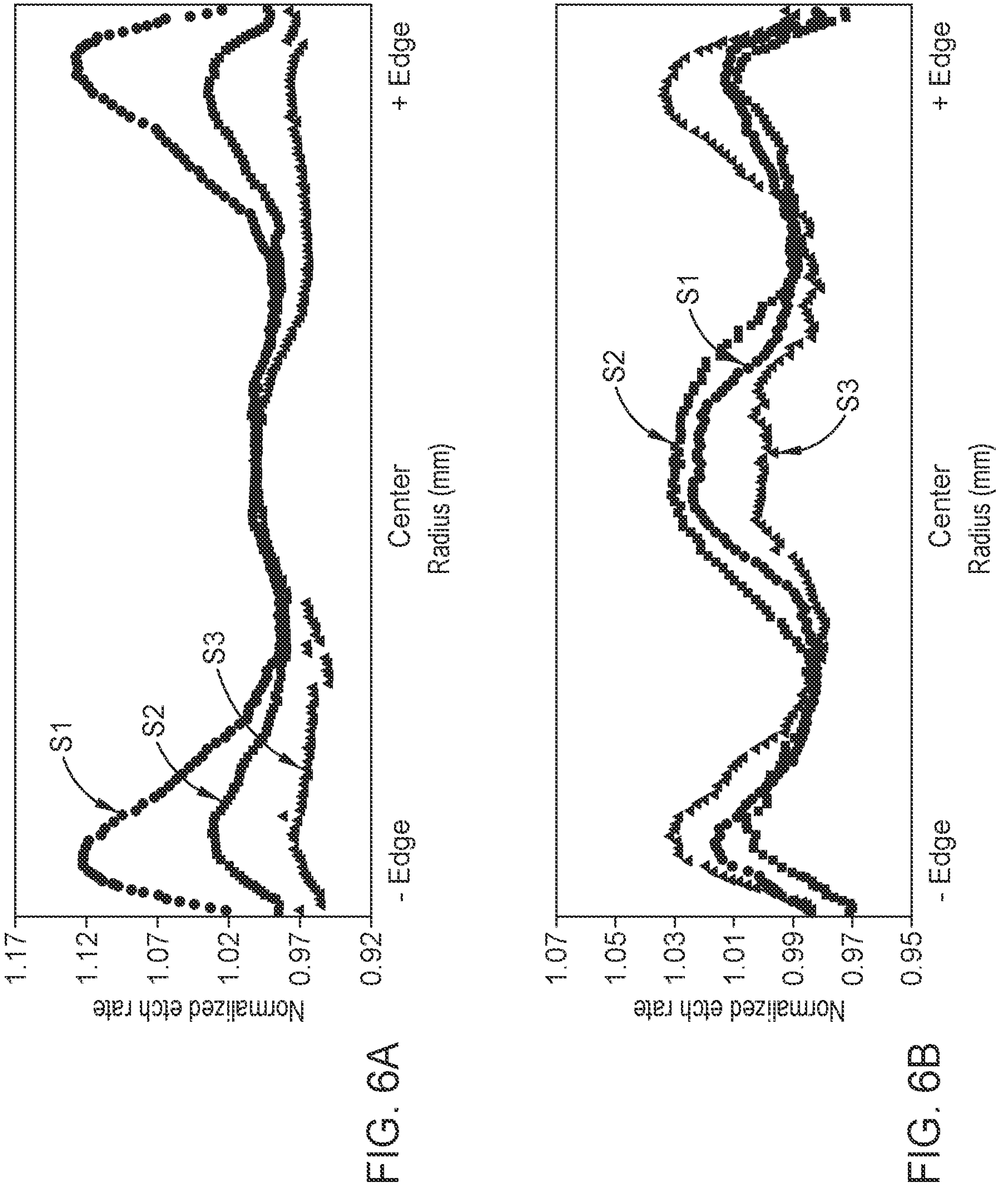
FIGS. 6A-6B are graphs of process results using an edge tuning circuit configurations according to embodiments described herein.

FIGS. 6A-6B are graphs of the effect on etch rate across a surface of a substrate formed by adjusting the characteristics of either an edge tuning circuit or a center tuning circuit, according to embodiments described herein. FIG. 6A illustrates the effect on etch rate caused by adjusting the capacitance of a variable capacitor in a tuning circuit 154 coupled to the edge electrode 115, as shown by curves S1, S2 and S3, respectively. FIG. 6B illustrates the effect on etch rate caused by adjusting the capacitance of a variable capacitor in a tuning circuit 154 coupled to the bias electrode 104, as shown by curves S1, S2 and S3, respectively.

Processing Method Example

Figure 7:
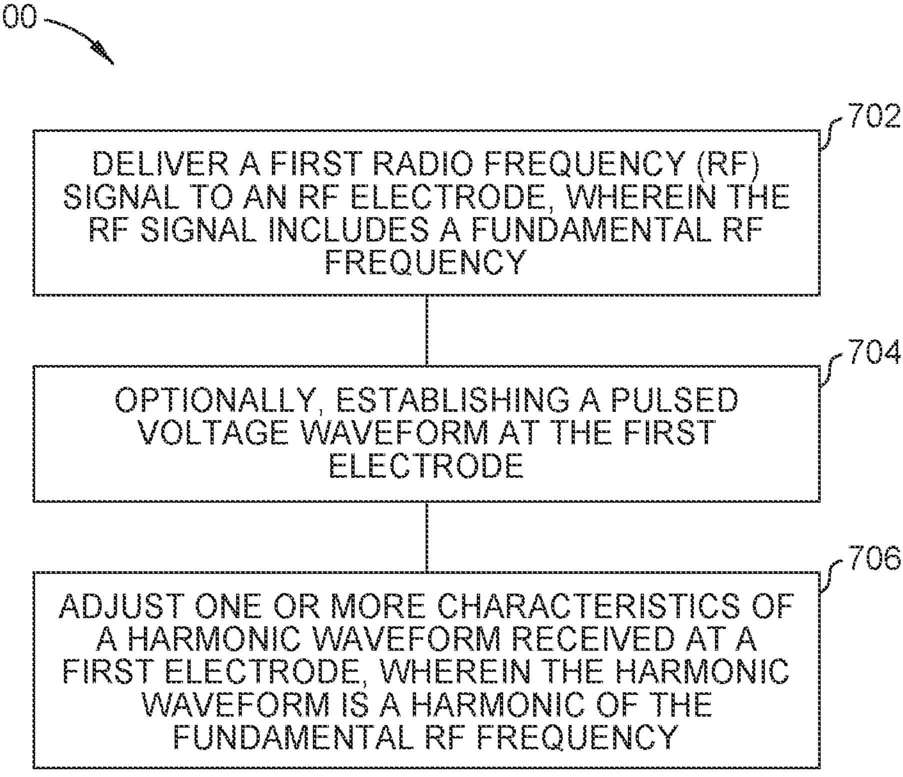
FIG. 7 is a diagram illustrating a processing method that can be performed using embodiments described herein.

FIG. 7 is a process flow diagram illustrating a method 700 of controlling plasma processing results on a substrate, according to one embodiment. At activity 702, the method 700 includes delivering a first radio frequency (RF) signal to an electrode, such as the support base 107 of a substrate support assembly 136, disposed in the processing volume 129 of a processing chamber 100. Generally, the RF signal is delivered to the electrode using a plasma generator assembly 163 that is electrically coupled thereto through an RF matching circuit 162 and a PV waveform filter 161. Here, the RF signal is configured to ignite and/or maintain a processing plasma 101 in a processing region 129A of the processing chamber 100, where the processing region 129A is disposed between the substrate support assembly 136 and the chamber lid 123. In some embodiments, the RF signal has a fundamental RF frequency of about 1 MHz or greater, such as about 13.56 MHz or greater, or even 40 MHz or greater.

In some embodiments, activity 702 further includes electrostatically clamping the substrate 103 to the substrate support 105 by delivering a chucking voltage to the bias electrode 104 from a DC power supply 155 that is electrically coupled to the bias electrode 104 using a power delivery line 157. The chucking voltage is used to create a potential difference between the substrate 103 and the bias electrode 104, and thus an electrostatic attraction (chucking force) through the capacitance of the first portion of dielectric material disposed therebetween. In some embodiments, the method 700 includes flowing an inert gas, e.g., helium, into a gap region disposed between the substrate 103 and the substrate supporting surface 105A and/or between the edge ring 114 and a surface of the substrate support assembly 136 to facilitate heat transfer therebetween.

At activity 704, the method 700 (optionally) includes establishing a pulsed voltage (PV) waveform at one or both of the bias electrode 104 and edge control electrode 115. Here, a first PV voltage waveform, which includes asymmetric voltage pulses, may be established at the bias electrode 104 using the first PV source assembly 196, and a second PV waveform may be established at the edge control electrode 115 using a second PV source assembly 197. As discussed above, the PV waveform generators 150 can be used to establish a nearly constant sheath voltage (e.g., a nearly constant difference between the substrate potential and the plasma potential) that provides a single peak IEDF for ions accelerated towards the substrate surface and/or can be manipulated to provide a desired IEDF profile of ion energy at the substrate surface.

In some embodiments, the first and/or second PV waveforms include a series of repeating cycles, where a waveform within each cycle has a first portion that occurs during a first time interval, e.g., the sheath formation phase and ion current phase, and a second portion that occurs during a second time interval, e.g., the sheath collapse phase. In some embodiments, the waveform that is established at the surface of the substrate is substantially constant during at least a portion of the second time interval, and the second time interval is longer than the first time interval. In some embodiments, the first and/or second PV waveforms each have a voltage peak in the first time interval and a substantially positive slope or a substantially negative slope during at least a portion of the second time interval. In some embodiments, the second time interval is longer than the first time interval. In other embodiments, the second time interval is shorter or about the same as the first time interval.

At activity 706, the method 700 includes adjusting one or more characteristics of a RF waveform having a fundamental frequency and harmonic RF frequency of the fundamental RF frequency received at the bias electrode 104 or the edge control electrode 115. In some embodiments, adjusting the one or more characteristics of the RF waveform at either or both fundamental and harmonic frequency, such as changing a voltage amplitude ratio of the RF waveform, adjusting a current amplitude ratio of the RF waveform, adjusting a phase difference between the RF voltage and RF current of the RF waveform, adjusting a phase difference of the RF voltage or RF current between the bias electrode 104 and the edge control electrode 115, adjusting a delivered power ratio between the bias electrode 104 and the edge control electrode 115, or a combination thereof. Adjusting the one or more characteristics of the RF waveform is performed by adjusting the electrical characteristics of one or more of the impedance producing elements within the tuning circuit 154.

In some embodiments, adjusting the harmonic waveform changes the plasma uniformity across at least a portion of the processing region 129A. For example, in one embodiment, the processing region 129A is defined by the chamber lid 123 and substrate support assembly 136, and the plasma 101 is a bulk plasma that is formed therebetween. In some embodiments, a first portion of the plasma 101 is formed in a region disposed between the chamber lid 123 and the bias electrode 104 and a second portion of the plasma 101 is formed in a region disposed between the chamber lid 123 and the edge control electrode 115. In those embodiments, adjusting the fundamental and/or harmonic waveform changes a plasma density in the second portion of the plasma 101 relative to a plasma density in the first portion of the plasma 101.

It has been found that by adjusting one or more of the variable impedance elements within a tuning circuit coupled to an electrode disposed within a processing volume, such as discussed above, the RF waveforms generated at two or more electrodes can be altered to adjust a process variable of a plasma processing process. It is believed that by adjusting the characteristics, such as amplitude and phase, of a fundamental and/or harmonic RF waveform, by adjusting one or more of the variable impedance elements within at least one tuning circuit coupled to an electrode, that the plasma density and sheath properties can be adjusted to improve the process results.

In some embodiments of the processing chamber 100, the system controller 126 is configured to automatically adjust the tuning circuit 154 based on desired processing conditions and/or desired characteristics for the fundamental and/or a selected harmonic RF waveform found at the edge control electrode 115 and/or the bias electrode 104. In some embodiments, the tuning circuit characteristics are controlled by adjusting one or more components of the tuning circuit 154 to a desired set point, and/or within desired control limits, where the desired set point and/or control lists are selected by a user and stored in the instructions used to control the processing system 10A, 10B. For example, the variable capacitances VC1, VC3 of the tuning circuit 154 may be controlled to a desired capacitance determined by a user and stored in memory of the system controller 126. However, in some embodiments, the tuning circuit 154 may be manually adjusted. The system controller 126 can utilize the information provided in experimental data, such as data found in FIGS. 5A-5D, to adjust and/or control the settings of the variable impedance elements found in a tuning circuit 154 prior to or during plasma processing.

The RF plasma density control methods may be implemented independently and/or in combination with the pulsed voltage (PV) waveform biasing methods to provide independent and fine control over ion energy, IEDF, ion directionality, ion flux, and activated neutral gas molecule flux at the substrate surface when compared to a conventional RF biased CCP system.

While the foregoing is directed to embodiments of the present disclosure, other and further embodiments of the disclosure may be devised without departing from the basic scope thereof, and the scope thereof is determined by the claims that follow.

What is claimed is:

1. A plasma processing chamber, comprising:

a substrate support assembly having a substrate supporting surface disposed within a processing volume of the plasma processing chamber, comprising:

a first electrode;

a first portion of dielectric material disposed over the first electrode, the first portion of dielectric material forming the substrate supporting surface; and a second electrode that is disposed a distance from the first electrode in a first direction that is parallel to the substrate supporting surface;

a first voltage generator electrically coupled to the first electrode and a first node, wherein the first node is at the output of the first voltage generator;

a radio frequency (RF) generator electrically coupled to an RF electrode, wherein the RF generator is configured to generate a plasma within the processing volume by delivering an RF signal to the RF electrode, and the RF signal comprises a fundamental RF frequency;

a first filter assembly electrically coupled between a first tuning circuit and the first node, wherein the first filter assembly comprises one or more capacitive and inductive elements, the first filter assembly including at least one parallel resonant circuit, at least one low pass filter, and one or more tuned shunt frequency elimination circuit that are configured to substantially block the fundamental RF frequency and harmonics of the fundamental RF frequency received at the first electrode from flowing to the first voltage generator; and the first tuning circuit electrically coupled between the first electrode and the first filter assembly, wherein the first tuning circuit comprises:

a plurality of impedance generating elements that include at least one or more variable impedance element, and the plurality of impedance generating elements of the first tuning circuit are configured to adjust one or more characteristics of the fundamental RF frequency and/or one of the harmonics of the fundamental RF frequency established at the first electrode when the plasma is generated in the processing volume.

2. The plasma processing chamber of claim 1, further comprising:

a signal detection module configured to detect a characteristic of the one of the harmonics of the fundamental RF frequency; and a system controller that is configured to adjust a setting of the one or more variable impedance elements of the first tuning circuit based on the detected characteristic of the one of the harmonics of the fundamental RF frequency.

3. The plasma processing chamber of claim 2, wherein the detected characteristic comprises an amplitude or a phase of the harmonics of the fundamental RF frequency, and the adjustment of the one or more variable impedance elements comprises adjusting a position of a variable capacitor of the one or more variable impedance elements.

4. The plasma processing chamber of claim 1, further comprising:

a signal detection module configured to detect a characteristic of the fundamental RF frequency; and a system controller that is configured to adjust a setting of the one or more variable impedance elements of the first tuning circuit based on the detected characteristic of the fundamental RF frequency.

5. The plasma processing chamber of claim 4, wherein the detected characteristic comprises an amplitude or a phase of the fundamental RF frequency, and the adjustment of the one or more variable impedance elements comprises adjusting a position of a variable capacitor of the one or more variable impedance elements.

6. The plasma processing chamber of claim 1, further comprising:

a second voltage generator electrically coupled to the second electrode;

a second filter assembly electrically coupled between the second electrode and the second voltage generator, wherein the second filter assembly comprises one or more capacitive and inductive elements that are configured to substantially block the fundamental RF frequency and the harmonics of the fundamental RF frequency from reaching the second voltage generator; and a second tuning circuit electrically coupled between the second electrode and the second filter assembly, wherein the tuning circuit comprises:

a plurality of impedance generating elements that include at least one or more variable impedance element, and the plurality of impedance generating elements of the second tuning circuit are configured to adjust one or more characteristics of one of the harmonics of the fundamental RF frequency established at the first electrode when the plasma is generated in the processing volume.

7. The plasma processing chamber of claim 6, further comprising:

a system controller that is configured to adjust a setting of the one or more variable impedance elements of the second tuning circuit based on a detected characteristic of the one of the harmonics of the fundamental RF frequency.

8. The plasma processing chamber of claim 7, wherein the detected characteristic comprises an amplitude or a phase of the harmonics of the fundamental RF frequency, and the adjustment of the one or more variable impedance elements comprises adjusting a position of a variable capacitor of the one or more variable impedance elements.

9. The plasma processing chamber of claim 1, further comprising:

a second voltage generator electrically coupled to the second electrode;

a second filter assembly electrically coupled between the second electrode and the second voltage generator, wherein the second filter assembly comprises one or more capacitive and inductive elements that are configured to substantially block the fundamental RF frequency and the harmonics of the fundamental RF frequency from reaching the second voltage generator; and a second tuning circuit electrically coupled between the second electrode and the second filter assembly, wherein the tuning circuit comprises:

a plurality of impedance generating elements that include at least one or more variable impedance element, and the plurality of impedance generating elements of the second tuning circuit are configured to adjust one or more characteristics of the fundamental RF frequency established at the first electrode when the plasma is generated in the processing volume.

10. The plasma processing chamber of claim 9, further comprising:

a system controller that is configured to adjust a setting of the one or more variable impedance elements of the second tuning circuit based on a detected characteristic of the fundamental RF frequency.

11. The plasma processing chamber of claim 10, wherein the detected characteristic comprises an amplitude or a phase of the fundamental RF frequency, and the adjustment of the one or more variable impedance elements comprises adjusting a position of a variable capacitor of the one or more variable impedance elements.

12. The plasma processing chamber of claim 1, further comprising:

computer-implemented instructions stored in memory which, when executed by a processor, are configured to perform a method of processing a substrate, comprising:

(i) igniting and maintaining a plasma from gases or vapors delivered to the processing volume, wherein a first portion of the plasma is formed over the substrate supporting surface of the substrate support assembly and the first electrode, and a second portion of the plasma is formed over the substrate supporting surface of the substrate support assembly and the second electrode; and (ii) adjusting, by use of the tuning circuit, one or more characteristics of the fundamental RF frequency and/or the one of the harmonics of the fundamental RF frequency at the first electrode relative to one or more characteristics of the fundamental RF frequency and/or the harmonics of the fundamental RF frequency at the second electrode to change a ratio of a plasma density in the second portion of the plasma to a plasma density in the first portion of the plasma.

13. The plasma processing chamber of claim 1, wherein the first voltage generator is configured to establish an asymmetric pulsed voltage waveform at the first electrode, the asymmetric pulsed voltage waveform comprises a series of repeating pulses, and each repeating pulse has a first portion that occurs during a first time interval and a second portion that occurs during a second time interval, the waveform has a voltage peak in the first time interval, and the waveform has a substantially positive slope, a substantially negative slope, or is substantially constant during at least a portion of the second time interval.

14. The plasma processing chamber of claim 1, wherein the at least one parallel resonant circuit comprises an inductor and a capacitor, and the at least one parallel resonant circuit is coupled between the first node and the tuning circuit.

15. The plasma processing chamber of claim 1, wherein the at least one low pass filter is coupled in series with the first node and the at least one parallel resonant circuit.

16. The plasma processing chamber of claim 1, wherein the at least one low pass filter is coupled in series between the first node and the tuning circuit.

17. The plasma processing chamber of claim 16, wherein the at least one low pass filter comprises a capacitor coupled between a power delivery line and ground.

18. The plasma processing chamber of claim 1, wherein the one or more tuned shunt frequency elimination circuit comprises an inductor and capacitor coupled in series between a power delivery line and ground.

19. The plasma processing chamber of claim 18, wherein the one or more tuned shunt frequency elimination circuit is coupled in series between the first node and the tuning circuit.

20. The plasma processing chamber of claim 1, wherein the tuning circuit comprises at least one inductor and at least one variable capacitor coupled in series between the power delivery line and ground.

21. The plasma processing chamber of claim 20, wherein the tuning circuit is coupled in series between the first electrode and the first filter assembly.

22. The plasma processing chamber of claim 1, wherein:

the at least one parallel resonant circuit comprises an inductor and a capacitor, and the at least one parallel resonant circuit is coupled between the first node and the tuning circuit, the one or more tuned shunt frequency elimination circuit comprises an inductor and capacitor coupled in series between a power delivery line and ground, and the one or more tuned shunt frequency elimination circuit is coupled in series between the first node and the tuning circuit.

23. The plasma processing chamber of claim 1, wherein:

the at least one parallel resonant circuit comprises an inductor and a capacitor, and the at least one parallel resonant circuit is coupled between the first node and the tuning circuit, the tuning circuit comprises at least one inductor and at least one variable capacitor coupled in series between the power delivery line and ground, and the tuning circuit is coupled in series between the first electrode and the first filter assembly.

* * * * *